United States Patent
Horii

(10) Patent No.: US 7,825,529 B2
(45) Date of Patent: Nov. 2, 2010

(54) SEMICONDUCTOR DEVICE AND DISPLAY DEVICE HAVING ALIGNMENT MARK

(75) Inventor: Hideaki Horii, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 174 days.

(21) Appl. No.: 11/905,988

(22) Filed: Oct. 5, 2007

(65) Prior Publication Data

US 2008/0121915 A1 May 29, 2008

(51) Int. Cl.
*H01L 23/544* (2006.01)
(52) U.S. Cl. .................. 257/797; 257/752; 257/758
(58) Field of Classification Search .............. 257/797, 257/752, 758
See application file for complete search history.

(56) References Cited

U.S. PATENT DOCUMENTS 5,858,854 A * 1/1999 Tsai et al. ............... 438/401
6,285,455 B1 * 9/2001 Shiraishi .................. 356/486
6,514,851 B2 * 2/2003 Saito ....................... 438/622
2003/0057452 A1 * 3/2003 Saito ....................... 257/200

FOREIGN PATENT DOCUMENTS

| JP | 7-221166 | 8/1995 |
|---|---|---|
| JP | 2000-182914 | 6/2000 |
| JP | 2001-155983 A | 6/2001 |

OTHER PUBLICATIONS

Korean Office Action dated Feb. 10, 2009 with Partial English-Language Translation of the Japanese-Language Translation.

* cited by examiner

*Primary Examiner*—Long Pham
(74) *Attorney, Agent, or Firm*—McGinn IP Law Group, PLLC

(57) ABSTRACT

A semiconductor device includes a semiconductor substrate and an alignment mark. The alignment mark is provided on the semiconductor substrate and optically detectable. The alignment mark includes a bright area and a dark area. The bright area outputs light reflected from a surface of the semiconductor substrate. The dark area includes metal wirings, outputs light reflected from surfaces of the metal wirings, and has brightness lower than that of the bright area.

19 Claims, 7 Drawing Sheets

SEMICONDUCTOR DEVICE AND DISPLAY DEVICE HAVING ALIGNMENT MARK

BACKGROUND OF THE INVENTION

1. Field of the Invention

The present invention relates to a semiconductor device and a display device, and more particularly to an alignment mark of a semiconductor device to be connected to a transparent substrate in a display device employing a Chip-on-Glass (COG) method.

2. Description of Related Art

In a display device employing a COG method, electrode terminals provided on a transparent substrate are connected with a driver IC (Integrated Circuit) for driving the display device. Hereinafter, the driver IC is referred to as the IC chip. Note that the COG refers to a technique in which the IC chip and the transparent substrate are directly connected to each other without interposing an FPC (Flexible Printed Circuit) or the like. The term "COG" will hereinafter be used as a generic term; however, the transparent substrate onto which the IC chip is to be mounted is not limited to glass, but may be plastic or the like. The transparent substrate is provided with electrodes for driving the display device, and the electrode terminals for supplying signals from the IC chip to the electrodes. Pads of the IC chip are connected to the electrode terminals through bumps, and output the signals for driving the display device to the electrodes. In the COG method, it is important to accurately align and connect the pads and the respectively corresponding electrode terminals when the IC chip and the electrode terminals are connected. In recent years, particularly, a circuit miniaturization has been significantly progressing, and an interval between the pads has become narrower. For this reason, only a slight misalignment between the pad and the corresponding electrode terminal causes a short circuit between the pads and an erroneous connection to an undesired electrode terminal.

In such the COG method, when the electrode terminals on the transparent substrate are connected to the pads on the IC chip, an alignment mark provided on the IC chip and that provided on the transparent substrate are detected from a side of the transparent substrate by a photo detector. Then, the IC chip and the transparent substrate are aligned such that positions of the both coincide with each other. The photo detector is required to accurately detect the alignment mark on the IC chip through the transparent substrate, so that the alignment mark is required to be easily recognizable.

A technique of an alignment mark provided on a semiconductor device is disclosed in Japanese Laid-Open Patent Application JP-P 2000-182914 A. In this technique, a wiring layer (an aluminum layer) is utilized to form a bright portion and a dark portion of the alignment mark. FIGS. 1A and 1B are schematic views showing a structure of the alignment mark 200 disclosed in JP-P 2000-182914 A. FIG. 1A is a plan view of the alignment mark 200 and FIG. 1B is a sectional view thereof along a line E-E' shown in FIG. 1A. Referring to FIG. 1B, the alignment mark 200 is formed above an interlayer insulation layer 140 such as a SiO$_2$ layer or the like on a silicon substrate 150. On the interlayer insulation layer 140, an interlayer insulation film 130 having a stripe pattern and a solid pattern is formed. On the interlayer insulation film 130, an aluminum layer 120 is formed, so that a fine stripe pattern and a solid pattern are formed on a surface of the aluminum layer 120 (see FIG. 1A). Note that a part of the aluminum layer 120 forming into the stripe pattern becomes a dark portion 202 because it scatters incident light, whereas the other part of the aluminum layer 120 forming into the solid pattern becomes a bright portion 201 that efficiently reflects the incident light in an incident direction. In addition, on the aluminum layer 120, a protective layer 110 for protecting the aluminum is provided.

Thus, according to the technique disclosed in this related art, the bright portion 201 and the dark portion 202 are formed by giving variety to geometry (layout pattern) of the aluminum layer 120, to thereby provide the easily recognizable alignment mark 200. Also, the alignment mark is formed by utilizing the aluminum layer 120, i.e., the wiring layer, so that the alignment mark can be formed simultaneously with the formation of the wiring layer in a circuit area, and therefore redundant steps for forming the alignment mark can be omitted.

Similarly to the above, a technique of an alignment mark utilizing a wiring layer (aluminum) is disclosed in Japanese Laid-Open Patent Application JP-P-Heisei 7-221166A. This alignment mark is a mark used for alignment in wafer dicing or lithography processing. The alignment mark is substantially formed of a high reflectivity pattern (bright portion) made of aluminum and the other low reflectivity pattern (dark portion) made of SiO$_2$ exposed.

We have now discovered following facts. In any of the alignment marks disclosed in JP-P 2000-182914 A and JP-P-Heisei 7-221166 A, the aluminum surface having high reflectivity is used for the bright portion. However, along with miniaturization of IC chips of recent years, an antireflection film such as a titanium nitride film is formed on an aluminum wiring in a wiring layer. For this reason, the high reflectivity arising from the aluminum surface cannot be expected. In a process of manufacturing a semiconductor device, when PR (Photo Resist) exposure is performed after preparing metal wiring, the antireflection film is formed on a surface of the metal wiring to prevent a PR resolution from being reduced due to reflected light from the metal wiring surface. Obviously, a reflectivity of the surface of the antireflection film is smaller than that of the metal wiring surface. Alternatively, depending on a process to be used, a barrier metal stacked on the metal wiring surface may serve as the antireflection film.

Even if the antireflection film is removed to thereby ensure the reflectivity of the aluminum surface, aluminum formed by PVD (Physical Vapor Deposition) or the like has grains 200$a$ as shown in FIGS. 1A and 1B. Since light is scattered by the irregular aluminum surface due to the grains 200$a$, reflectivity of the irregular aluminum surface remarkably decreases as compared with that of an ideally flat aluminum surface. That is, a difference in reflectivity from the surrounding dark portion becomes small, and therefore a contrast ratio is reduced. For this reason, in the disclosed technique, it is difficult to detect the alignment mark with naked eyes or a photo detector, and therefore it is difficult to execute a highly accurate alignment. In particular, in a case where the IC chip is mounted on a display panel based on the COG method in which the alignment mark is detected through the transparent substrate, it is important to increase the contrast ratio of brightness to darkness of the alignment mark.

SUMMARY

The present invention seeks to solve one or more of the above problems, or to improve upon those problems at least in part. In one embodiment, a semiconductor device includes: a semiconductor substrate; and an alignment mark configured to be provided on the semiconductor substrate and optically detectable, wherein the alignment mark includes: a bright area configured to output light reflected from a surface of the semiconductor substrate, and a dark area configured to include metal wirings, output light reflected from surfaces of the metal wirings, and have brightness lower than that of the bright area.

In the present invention, the bright area outputs light reflected from the surface of the semiconductor substrate, while the dark area outputs light reflected from the surface of the metal wirings. Since the surface flatness of the semiconductor substrate is higher than that of the metal wirings, an amount of light scattered by the surface of the semiconductor substrate is smaller than that by the surface of the metal wirings. Therefore, the brightness of the semiconductor substrate is higher than that of the metal wirings. For this reason, a contrast ratio of the bright area to the dark area can be improved and therefore a position and shape of the alignment mark can be accurately detected.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Embodiments of a semiconductor device and a display device according to the present invention will be described below with reference to the attached drawings. Here, an IC chip 10 and a liquid crystal panel 100 will be described as the semiconductor device and the display device, respectively. In this embodiment, the liquid crystal panel 100 connected with the IC chip 10 by the COG method is described as an example.

1. A Structure of the Liquid Crystal Panel

Figure 1A:
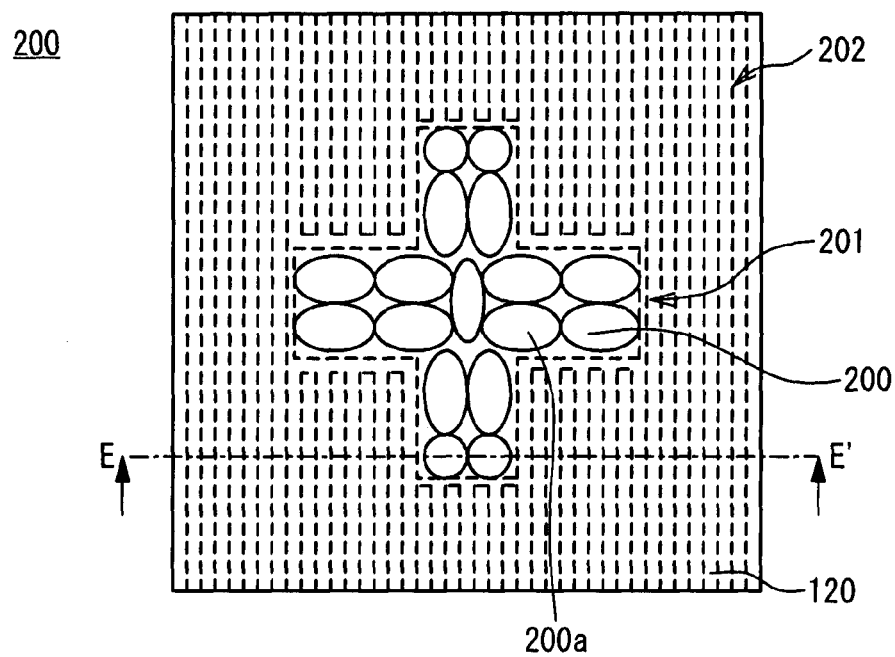
FIG. 1A is a schematic plan view showing a structure of an alignment mark according to JP-P 2000-182914 A.
Figure 1B:
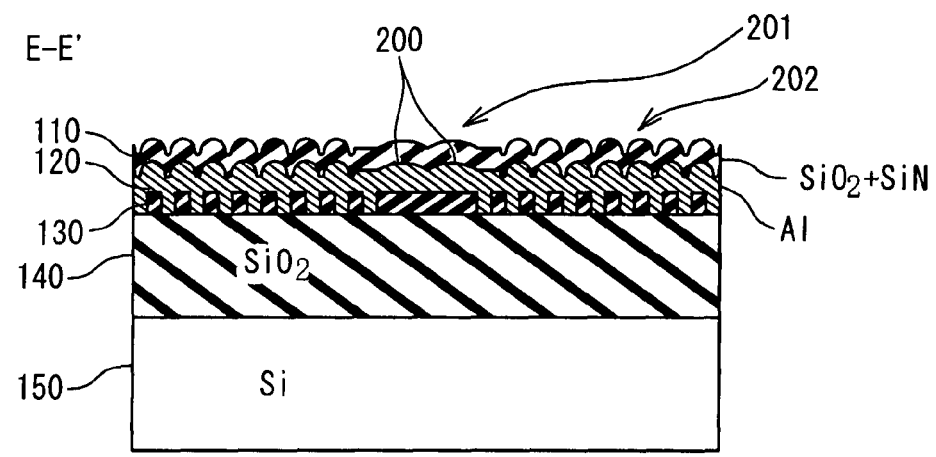
FIG. 1B is a schematic sectional view along a line E-E' shown in FIG. 1A.
Figure 2:
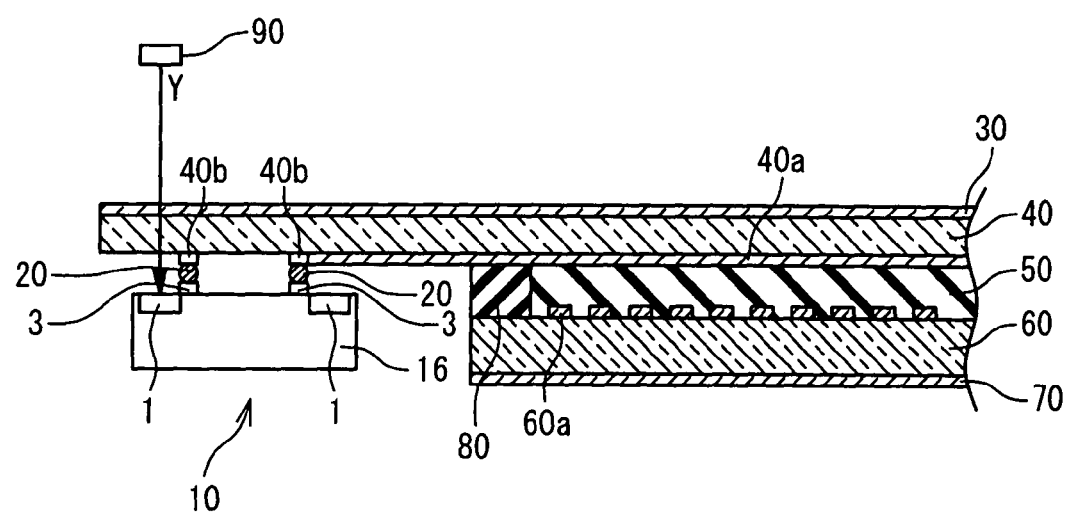
FIG. 2 is a sectional view showing a structure of a liquid crystal panel mounted with an IC chip according to the present invention.

A structure of the liquid crystal panel 100 according to the present invention is described referring to FIG. 2. FIG. 2 is a sectional view showing a structure of the liquid crystal panel 100 mounted with the IC chip 10. The liquid crystal panel 100 includes: the IC chip 10 which has a liquid crystal driving IC; transparent substrates 40 and 60; polarizing plates 30 and 70; liquid crystal 50; and a sealing material 80. The liquid crystal 50 is sandwiched between the transparent substrates 40 and 60 facing to each other, and sealed by the sealing material 80. Also, electrodes 40a and 60a are respectively provided on the transparent substrates 40 and 60 so as to sandwich the liquid crystal 50, and form an array of pixels along with the liquid crystal 50. To the electrodes 40a and 60a, a data (display) signal and a scan signal are supplied from the liquid crystal driving ICs, and depending on these signals, brightness (luminance)/darkness of any of the pixels are determined. Further, on surfaces of the transparent substrates 40 and 60 on a side opposite to the liquid crystal 50, the polarizing plates 30 and 70 are respectively provided.

The electrodes 40a and 60a are extended outside a display portion having the liquid crystal 50, and connected to the liquid crystal driving ICs through electrode terminals. In FIG. 2, electrode terminals 40b and the IC chip 10 connected to the electrodes 40a are only illustrated, and electrode terminals and a liquid crystal driving IC connected to the electrodes 60a are omitted (not shown). In the following, the IC chip 10 connected to the electrode terminals 40b will be described; however, it should be appreciated that the omitted liquid crystal driving IC can be similarly described.

The IC chip 10 is mounted on the transparent substrate 40 through bumps 20. At this time, it is necessary to accurately align and bond pads 3 on the IC chip 10 to the respectively corresponding electrode terminals 40b of the transparent substrate 40. In a method for aligning the IC chip 10 and the transparent substrate 40 in the liquid crystal panel 100 using the COG method, an alignment mark provided on the IC chip 10 is detected from a Y direction by a photo detector 90, and then a position of the transparent substrate 40 or IC chip 10 is adjusted such that the alignment mark on the IC chip 10 is aligned with that on the transparent substrate 40 or a relative position therebetween is brought into a desired condition. Note that the alignment mark (not shown) formed on the transparent substrate 40 is typically provided on a surface on a side of the IC chip 10 so that the photo detector 90 can be easily focused.

Figure 3:
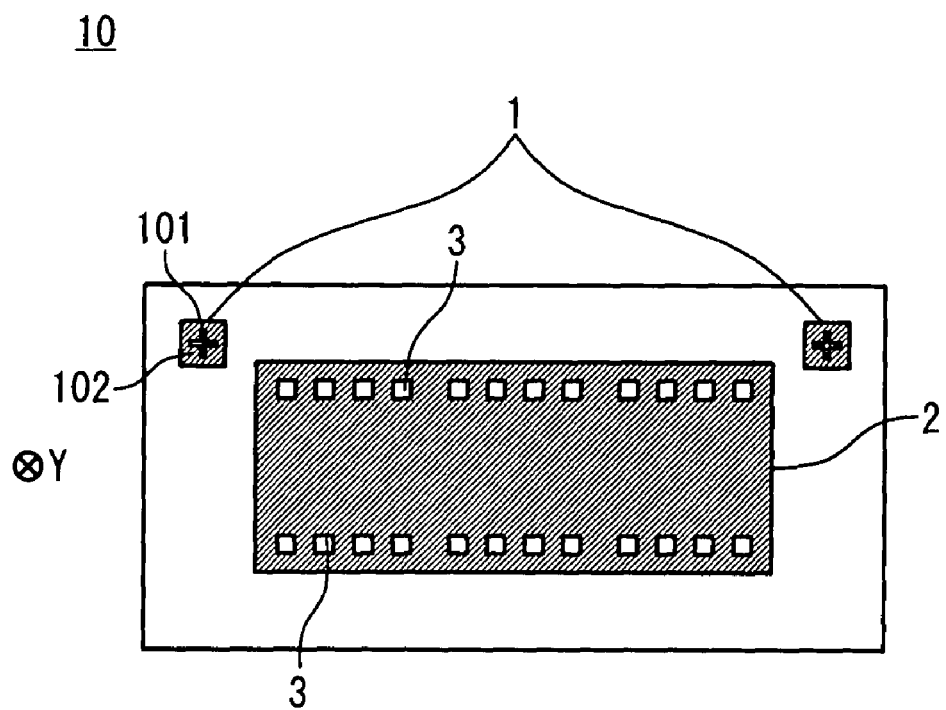
FIG. 3 is a plan view showing a structure of the IC chip according to the present invention, as viewed from a photo detector side.

The alignment mark structure 1 (hereinafter referred to as the alignment mark 1) provided on a bonding face side of the IC chip 10 is formed on a silicon substrate 16 of the IC chip 10 so as to be visible through the transparent substrate 40. Here, the alignment mark 1 is formed on the same face as that on which the pads 3 are formed. FIG. 3 is a plan view showing a structure of the bonding face (a surface of the IC chip 10 as viewed from the photo detector 90) of the IC chip 10. Referring to FIG. 3, at least one alignment mark 1, a circuit area 2 having an IC circuit pattern, and a plurality of pads 3 are formed on the bonding face of the IC chip 10. The photo detector 90 recognizes a position and shape of the alignment mark 1 by detecting a bright portion (a cross-shaped bright area 100 herein) and a dark portion (a square-shaped dark area 102 having the cross-shaped hollow area herein) of the alignment mark 1. That is, the alignment mark 1 is optically and visually detectable.

2. A Structure of the Alignment Mark 1 in a First Embodiment

Figure 4A:
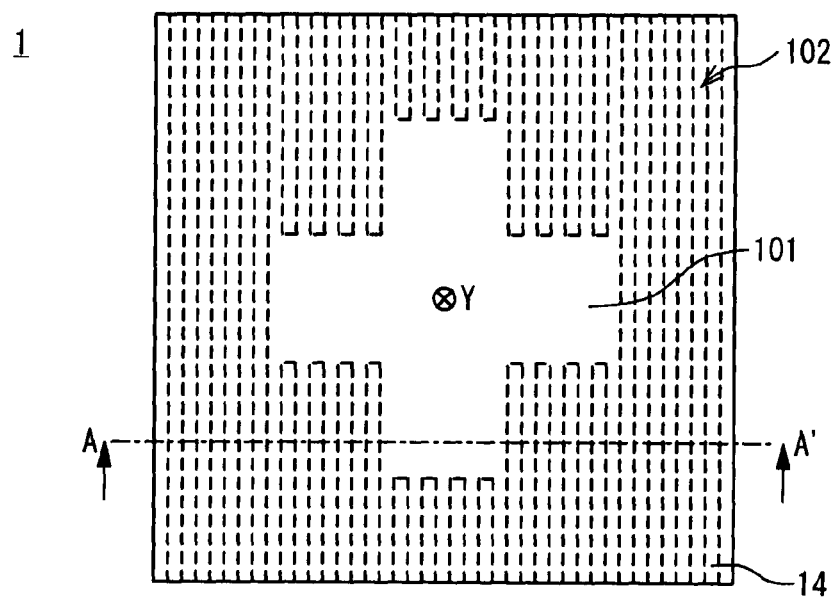
FIG. 4A is a plan view showing a structure of an alignment mark in a first embodiment according to the present invention, as viewed form the photo detector side.
Figure 4B:
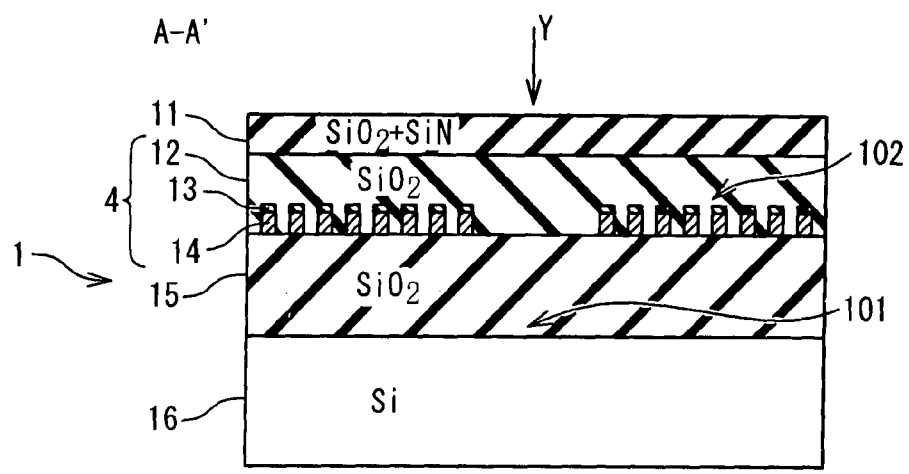
FIG. 4B is a sectional view along the line A-A' shown in FIG. 4A.

A structure of the alignment mark 1 in a first embodiment is described referring to FIGS. 4A and 4B. FIG. 4A is a plan view showing the structure of the alignment mark 1 as viewed from the photo detector 90 (viewed from the Y direction). Also, FIG. 4B is a sectional view along the line A-A' shown in FIG. 4A.

Referring to FIG. 4B, the alignment mark 1 in the first embodiment includes an interlayer insulation layer 15, a wiring layer 4, and a passivation layer 11, all formed on a silicon substrate 16. On the silicon substrate 16, the interlayer insulation layer 15 such as a $SiO_2$ layer, the wiring layer 4, and the passivation layer 11 such as a $SiO_2$ layer+a SiN layer are sequentially stacked in this order.

In the circuit area 2, circuit elements and the like are formed on a layer same as the interlayer insulation layer 15, and metal wirings connected to the circuit elements are formed on a layer same as the wiring layer 4. Alternatively, in a case of a multilayer wiring structure, there is a plurality of wiring layers which includes the wiring layer 4. In this case, the wiring layer 4 may be provided on or under any of the plurality of wiring layers.

The wiring layer 4 includes an interlayer insulation film 12, metal wirings 14 and antireflection films 13. The interlayer insulation film 12 is formed on the interlayer insulation layer 15 and the antireflection films 13 and fills gaps between the metal wirings 14. The metal wirings 14 are formed on the interlayer insulation layer 15. On each of the metal wirings 14, the antireflection film 13 is stacked. Specifically, the wiring layer 4 includes a dark area 102 and a bright area 101. The dark area 102 is visually and optically recognized as a dark portion due to the presence of the metal wirings 14. The bright area 101 is visually and optically recognized as a bright portion because the metal wirings 14 are not formed in this area.

On the metal wirings 14, the antireflection film 13 such as a titanium nitride (TiN) film is stacked. An incident light from the photo detector 90 (Y direction) is reflected by surfaces of the metal wirings 14 toward the transparent substrate 40 through the antireflection film 13. The antireflection film 13 typically exhibits orange-tan color by its antireflection function. Further, the incident light is scattered by grains exposed at the surfaces of the metal wirings 14. Therefore, the photo detector 90 detects the area including the metal wirings 14 as the dark area 102.

Figure 5A:
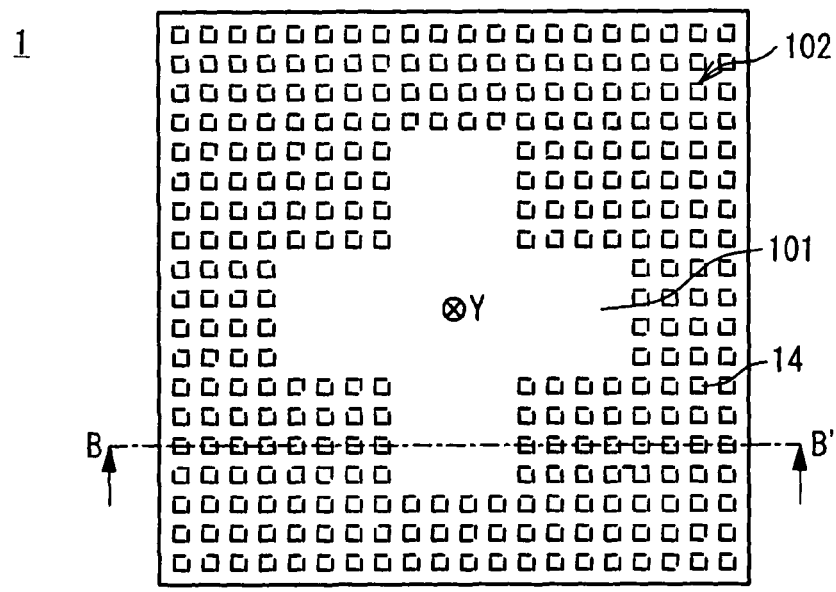
FIG. 5A is a plan view showing a structure of another example of an alignment mark in the first embodiment according to the present invention, as viewed form the photo detector side.
Figure 5B:
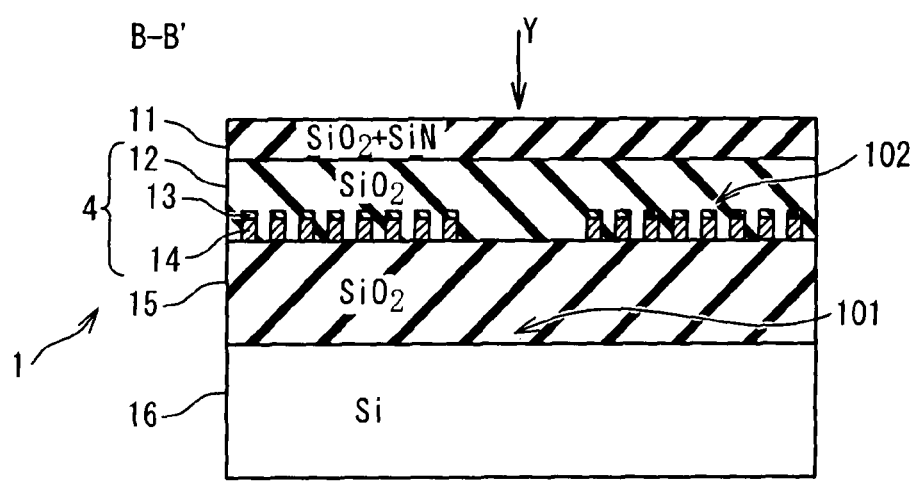
FIG. 5B is a sectional view along the line B-B' shown in FIG. 5A.

Referring to FIG. 4A, the dark area 102 is preferably formed around the bright area 101 where the metal wirings 14 are not formed, as viewed to the Y direction. Also, the metal wirings 14 forming the dark area 102 may be formed in a solid pattern. However, in order to make the dark area 102 darker, the metal wirings 14 are preferably formed in a fine pattern in which fine shapes are arranged at predetermined intervals so as to scatter the incident light. As the example, FIGS. 4A and 4B illustrate the metal wirings 14 formed in a stripe pattern. The fine pattern formed by the metal wirings 14 is not limited to the stripe pattern, but may be any pattern such as a dot pattern, a grid pattern, or a spiral pattern as long as it can form the dark area 102. FIG. 5A is a plan view showing a structure of another example of the alignment mark 1 as viewed from the photo detector 90 (viewed from the Y direction). Also, FIG. 5B is a sectional view along the line B-B' shown in FIG. 5A. In this example, the metal wirings 14 are formed in a dot pattern. Since this structure is the same as that shown in FIGS. 4A and 4B except for the pattern of the metal wirings 14, further explanation is omitted.

In the cases using above mentioned patterns, the interval between the metal wirings 14 forming the fine pattern (an interval between the metal wirings 14 in the dark area 102) is set to an appropriate distance for being detected as the dark portion by the photo detector 90. If the interval is too large, brightness (luminance) of the dark area 102 becomes higher, and therefore a contrast ratio to the bright area 101 is reduced. Therefore, the metal wirings 14 are preferably formed not to have large intervals. Also, the metal wirings 14 may be aluminum or copper wiring. Further, as the antireflection film 13, an antireflection film formed from another material may be employed. In addition, the metal wirings 14 and antireflection film 13 are preferably formed in the same processes and composed of the same materials as those of metal wirings in a layer in the circuit area 2, wherein the layer in the circuit area 2 is a same layer as the wiring layer 4. This prevents an increase in manufacturing cost because it is not necessary to introduce additional steps and materials for forming the alignment mark 1 in the semiconductor device manufacturing process.

In an area in which the metal wirings 14 is not formed in the wiring layer 4, the incident light from the photo detector 90 (Y direction) is reflected by a surface of the silicon substrate 16. The photo detector 90 detects a reflected light from the surface of the silicon substrate 16 through the bright area 101 having brightness higher than that of the dark area 102. In the technique of the related art, the reflectivity of the bright area is reduced due to the grains at the surface of the aluminum wiring. However, a surface flatness of the silicon substrate 16 is very high, so that an amount of scattered light is very small, and thus the reflectivity in the Y direction (direction to the photo detector 90) is high. For this reason, the use of the silicon substrate 16 improves the brightness of the bright area 101 as compared with the technique of the related art. That is, in the alignment mark 1 according to the present invention, an improvement in brightness of the bright area 101 improves a contrast ratio to the dark area 102, and therefore a position and shape of the alignment mark can be accurately detected.

In this embodiment, a shape of the bright area 101 is visible (detectable) as a cross-shaped pattern. However, it is not limited to the cross shape, but may be any shape (alignable shape) that corresponds to a shape of the alignment mark on the transparent substrate 40, which is an object of the alignment.

3. A Structure of an Alignment Mark 1 in the Second Embodiment

Figure 6A:
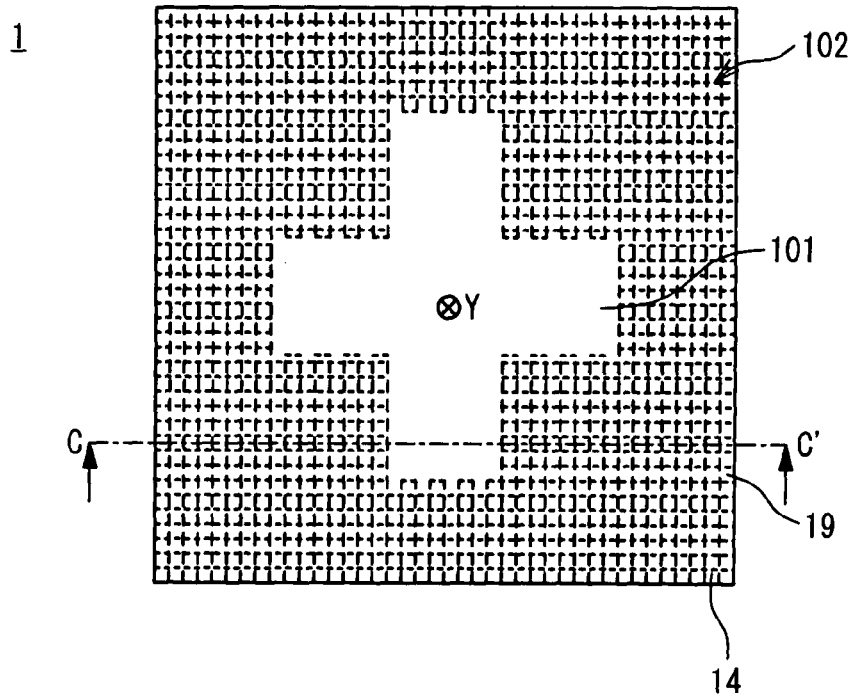
FIG. 6A is a plan view showing a structure of an alignment mark in a second embodiment according to the present invention, as viewed from the photo detector side.
Figure 6B:
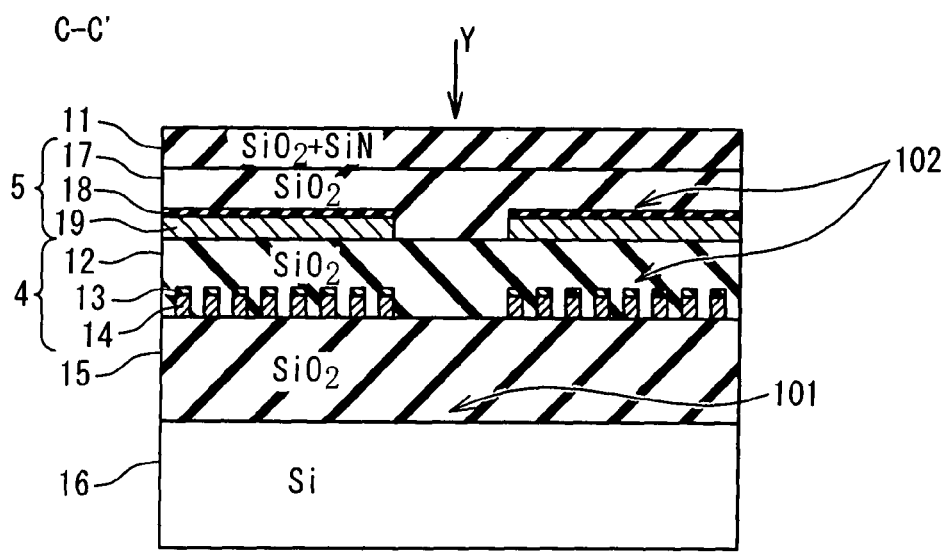
FIG. 6B is a sectional view along the line C-C' shown in FIG. 6A.

A structure of the alignment mark 1 in a second embodiment is described referring to FIGS. 6A to 6B. FIG. 6A is a plan view showing the structure of the alignment mark 1 as viewed from the photo detector 90 (viewed from the Y direction). Also, FIG. 6B is a sectional view along the line C-C' shown in FIG. 6A.

In the alignment mark 1 of the first embodiment, the metal wirings provided in the one wiring layer form the dark area. However, the dark area of the alignment mark 1 may be formed by a plurality of wiring layers. In the second embodiment, the dark area of the alignment mark 1 is formed by metal wirings provided in each of the plurality of wiring layers (two (2) layers herein). The alignment mark 1 in the second embodiment has the structure further including a wiring layer 5 formed on or under the wiring layer 4 of the first embodiment. In this example, the alignment mark 1 further includes one wiring layer 5 formed on the wiring layer 4. In the circuit area 2, metal wirings connected to the circuit elements and the like in the circuit area 2 are also formed in the layer same as the wiring layer 5.

The structure of the alignment mark 1 in which the wiring layer 5 is provided on the wiring layer 4 is described referring to FIGS. 6A and 6B. The wiring layer 5 includes an interlayer insulation film 17, metal wirings 19 and antireflection films 18. In this case, the interlayer insulation film 17 is formed on the interlayer insulation layer 12 and the antireflection films 18 and fills gaps between the metal wirings 19. The metal wirings 19 are formed on the interlayer insulation layer 12. On each of the metal wirings 19, an antireflection film 18 is stacked. As a layer on the interlayer insulation film 17, a passivation layer 11 same as in the first embodiment is formed.

As mentioned in the first embodiment, the wiring layers 4 and 5 include a dark area 102 and a bright area 101. The dark area 102 is visually and optically recognized as a dark portion due to the presence of the metal wirings 14 and 19. The bright area 101 is visually and optically recognized as a bright portion because the metal wirings 14 and 19 are not formed in this area.

Referring to FIG. 6A, the metal wirings 19 are formed so as to intersect with metal wirings 14 as viewed to the Y direction. Also, the metal wirings 19 and antireflection films 18 are not formed in an area above the silicon substrate 16 that becomes the above-described bright area 101. For this reason, the photo detector 90 detects an area formed with the metal wirings 14 and 19 as the dark area 102, and an area not formed with the metal wirings 14 or 19 as the bright area 101. In addition, materials and a stack order of the metal wirings 19 and antireflection film 18 are the same as in a case of the metal wirings 14 and antireflection film 13. That is, reflected light from a surface of the metal wirings 19 is detected by the photo detector 90 through the antireflection film 18. However, the surface of the metal wiring 19 is in a state where the incident light is easily scattered because of the presence of the grains.

In the structure illustrated in FIGS. 6A and 6B, the metal wirings 19 and antireflection films 18 are formed in the layer on the area in which the metal wirings 14 are formed. The metal wirings 19 may be formed in a solid pattern. However, similarly to the metal wirings 14, they are preferably formed in a fine pattern in which fine shapes are arranged at predetermined intervals. As an example, FIG. 6A illustrates the metal wirings 19 formed in a stripe pattern. At this time, the interval between the metal wirings 19 forming the fine pattern is set to an appropriate distance for being detected as the dark portion. Here, the metal wirings 14 are formed in the same stripe pattern as the pattern illustrated in FIG. 4A, and the metal wirings 19 (e.g. polysilicon gates) are formed in a stripe pattern so as to have a longitudinal direction that is a direction perpendicular to a longitudinal direction of the metal wirings 14. Also, the fine pattern formed as the metal wirings 19 (e.g. polysilicon gates) and the antireflection films 18 (e.g. gate oxide films) is not limited to the stripe pattern; but may be any pattern such as a dot pattern, a grid pattern, or a spiral pattern as long as it can form the dark area 102.

In the present embodiment, the area in which neither the metal wirings 14 nor 19 are formed becomes the bright area 101. That is, the bright area 101 in the second embodiment is formed by a surface of the silicon substrate 16, similarly to the first embodiment.

The dark area 102 in the second embodiment employs the surfaces of the metal wirings formed in the plurality of wiring layers, so that scattering of the incident light is enhanced, and brightness of the dark area 102 is reduced as compared with that of the first embodiment. For this reason, the contrast ratio to the bright area 101 is further increased, and therefore the alignment mark 1 can be accurately detected. Also, similarly to the wiring layer 4, the wiring layer 5 is preferably formed in the same process and composed of the same material as those of the wiring layer connected to the circuit elements and the like formed in the circuit area 2. This prevents an increase in manufacturing cost because it is not necessary to introduce additional steps and materials for forming the alignment mark 1 in the semiconductor device manufacturing process.

Figure 7A:
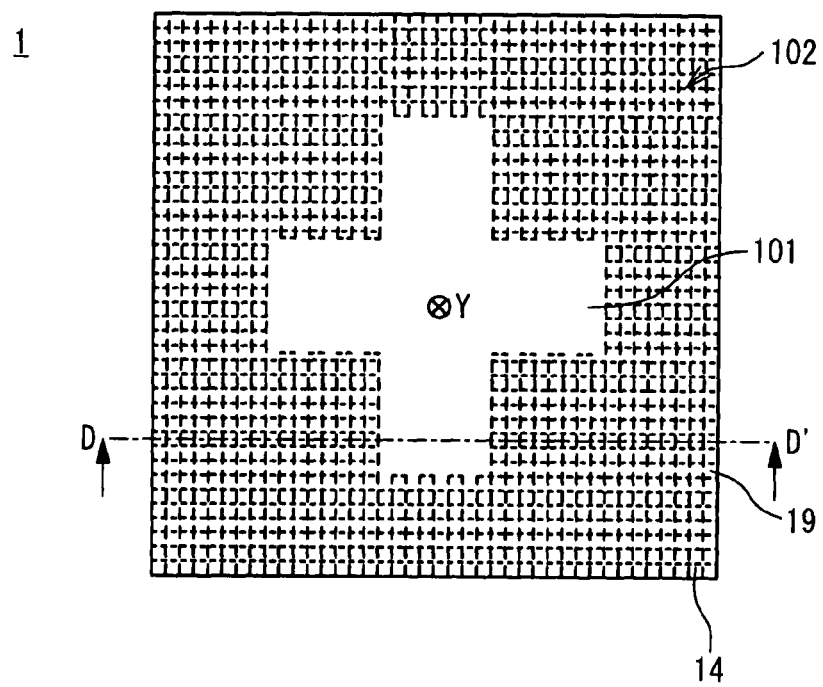
FIG. 7A is a plan view showing a structure of another example of an alignment mark in the second embodiment according to the present invention, as viewed form the photo detector side.
Figure 7B:
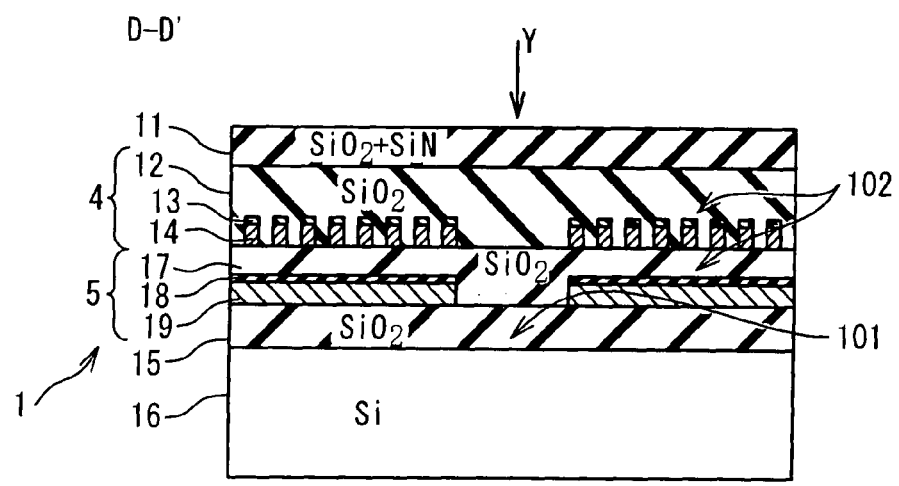
FIG. 7B is a sectional view along the line D-D' shown in FIG. 7A.

A structure of another example of the alignment mark 1 in which the metal wirings 19 is provided in the layer under the wiring layer 4 is described referring to FIGS. 7A and 7B. FIG. 7A is a plan view showing a structure of another example of an alignment mark 1 as viewed from the photo detector 90 (viewed from the Y direction). Also, FIG. 7B is a sectional view along the line D-D' shown in FIG. 7A. Referring to FIG. 7B, the wiring layer 5 having the metal wirings 19 and antireflection film 18 is formed under the wiring layer 4. Since this structure is the same as that shown in FIGS. 6A and 6B except for the positional relation between the wiring layers 4 and 5, further explanation is omitted.

The wiring layer 5 is herein formed on the interlayer insulation layer 15. However, a vertical order therebetween may be any order. Also, there may be a plurality of interlayer insulation layers 15.

Even in the structure in which the wiring layer 5 (metal wirings 19) is provided under the wiring layer 4, the dark area 102 is formed by the surfaces of the metal wirings 14 and 19, and the alignment mark 1 having a high contrast ratio can be formed, similarly to the above-described case shown in FIGS. 6A and 6B.

As described above, according to the present invention, the alignment mark 1 is formed of the bright area 101 based on the surface of the silicon substrate 16 and the dark area 102 based on the metal wirings 14 formed in a peripheral area the bright area 101. For this reason, the brightness of the bright area 101 can be improved, and therefore the position and shape of the alignment mark can be accurately detected. Consequently, the IC chip 10 and transparent substrate 40 can be accurately aligned with use of the alignment mark 1 according to the present invention.

The embodiments of the present invention have been described in detail; however, a specific configuration is not limited to the above-described embodiments, but even if they are modified without departing from the scope of the present invention, they are included in the present invention. In any of the above embodiments, the silicon substrate surface is used as the bright area; however, any substrate having another composition (e.g., gallium nitride substrate) may be used if its surface flatness is high enough.

In the semiconductor device and display device according to the present invention, the alignment mark can be accurately detected. Also, a highly accurate alignment becomes possible. Further, the alignment mark can be formed without increasing the number of manufacturing steps of the semiconductor device.

It is apparent that the present invention is not limited to the above embodiment, but may be modified and changed without departing from the scope and spirit of the invention.

What is claimed is:

1. A semiconductor device, comprising:
  a semiconductor substrate; and
  an alignment mark provided on said semiconductor substrate and being optically detectable,
  wherein said alignment mark includes:
    a bright area to output light reflected from a surface of said semiconductor substrate, and
    a dark area that includes metal wirings, having a flat surface, to output light reflected from surfaces of said metal wirings, said dark area having a brightness lower than that of said bright area.

2. The semiconductor device according to claim 1, wherein said dark area includes:
   antireflection films formed on said surfaces of said metal wirings, respectively, and
   wherein said light reflected from said surfaces of said metal wirings is outputted through said antireflection films.

3. The semiconductor device according to claim 1, wherein said metal wirings are formed in a fine pattern in which fine shapes are arranged at predetermined intervals.

4. The semiconductor device according to claim 3, wherein said fine pattern is one of a stripe pattern, a dot pattern, a grid pattern, and a spiral pattern.

5. The semiconductor device according to claim 1, further comprising:
   a circuit formed on said semiconductor substrate which includes circuit elements,
   wherein said metal wirings are formed in a layer same as a wiring layer in which circuit metal wirings connected to said circuit elements are formed.

6. The semiconductor device according to claim 5, wherein said metal wirings comprise a material same as that of said circuit metal wirings.

7. The semiconductor device according to claim 1, wherein said metal wirings includes polysilicon gates, and
   wherein said dark area includes an area in which said light reflected from said surfaces of said polysilicon gates is outputted.

8. The semiconductor device according to claim 1, wherein said dark area includes:
   a first wiring layer that includes said metal wirings, and
   a second wiring layer formed on or under said first wiring layer, and includes second metal wirings,
   wherein said dark area outputs said light reflected from said surfaces of said metal wirings and light reflected from surfaces of said second metal wirings.

9. The semiconductor device according to claim 8, wherein said dark area includes:
   second antireflection films formed on said surfaces of said second metal wirings, respectively,
   wherein said light reflected from said surfaces of said second metal wirings is outputted through said second antireflection films.

10. A display device, comprising:
    a semiconductor device; and
    a transparent substrate configured to mount said semiconductor device,
    wherein said semiconductor device includes:
      a semiconductor substrate; and
      an alignment mark provided on said semiconductor substrate and being optically detectable, and
    wherein said alignment mark comprises:
      a bright area to output light reflected from a surface of said semiconductor substrate, and
      a dark area that includes metal wirings, having a flat surface, to output light reflected from surfaces of said metal wirings, said dark area having a brightness lower than that of said bright area.

11. The display device according to claim 10, wherein said dark area includes:
    antireflection films formed on said surfaces of said metal wirings, respectively, and
    wherein said light reflected from said surfaces of said metal wirings is outputted through said antireflection films.

12. The display device according to claim 10, wherein said metal wirings are formed in a fine pattern in which fine shapes are arranged at predetermined intervals.

13. The display device according to claim 12, wherein said fine pattern is one of a stripe pattern, a dot pattern, a grid pattern, and a spiral pattern.

14. The display device according to claim 10, wherein said semiconductor device further includes:
    a circuit area configured to be formed on said semiconductor substrate and include circuit elements, and
    wherein said metal wirings is formed in a layer same as a wiring layer in which circuit metal wirings connected to said circuit elements are formed.

15. The display device according to claim 14, wherein said metal wirings comprise a material same as that of said circuit metal wirings.

16. The display device according to claim 10, wherein said metal wirings includes polysilicon gates, and
    wherein said dark area includes an area in which said light reflected from said surfaces of said polysilicon gates is outputted.

17. The display device according to claim 10, wherein said dark area includes:
    a first wiring layer includes said metal wirings, and
    a second wiring layer formed on or under said first wiring layer that includes second metal wirings, and
    wherein said dark area outputs said light reflected from said surfaces of said metal wirings and light reflected from surfaces of said second metal wirings.

18. The semiconductor device according to claim 1, wherein said metal wirings are provided other than in the bright area.

19. The display device according to claim 10, wherein said metal wirings are provided other than in the bright area.

* * * * *